United States Patent [19]

Rodder

[11] Patent Number: 5,324,961

[45] Date of Patent: Jun. 28, 1994

[54] STACKED CAPACITOR SRAM CELL

[75] Inventor: Mark S. Rodder, University Park, Tex.

[73] Assignee: Texas Instruments Incorporated, Dallas, Tex.

[21] Appl. No.: 124,371

[22] Filed: Sep. 20, 1993

Related U.S. Application Data

[60] Continuation of Ser. No. 928,248, Aug. 11, 1992, abandoned, which is a division of Ser. No. 647,879, Jan. 30, 1991, Pat. No. 5,145,799.

[51] Int. Cl.$^5$ ............................................. H01L 27/11
[52] U.S. Cl. ...................................... 257/69; 257/306; 257/904
[58] Field of Search .................. 257/903, 904, 69, 306, 257/296; 365/154, 156

[56] References Cited

U.S. PATENT DOCUMENTS

| 4,679,171 | 7/1987 | Logwood et al. | 365/154 |
| 4,970,564 | 11/1990 | Kimura et al. | 357/23.6 |
| 4,984,200 | 1/1991 | Saitoo et al. | 365/154 |
| 5,194,749 | 3/1993 | Meguro et al. | 257/903 |

FOREIGN PATENT DOCUMENTS

| 0320405 | 12/1988 | European Pat. Off. |
| 2-134869 | 5/1990 | Japan | 365/154 |
| 2-295164 | 12/1990 | Japan | 365/154 |

*Primary Examiner*—Robert Limanek
*Attorney, Agent, or Firm*—Dana L. Burton; Richard A. Stoltz; James C. Kesterson

[57] ABSTRACT

This is an SRAM cell and the cell can comprise: two NMOS drive transistors; two PMOS load transistors; first and second bottom capacitor plates 50,52, with the first plate 50 being over a gate 34 of one of the drive transistors and the second plate 52 being over a gate 40 of another of the drive transistors; a layer of dielectric material 68 over the first and second bottom capacitor plates; and first and second top capacitor plates 20, 26, over the dielectric layer, with the first top capacitor 20 plate forming a gate of one of the load transistors and with the second top capacitor plate 26 forming a gate of another of the load transistors whereby the capacitor plates form two cross-coupled capacitors between the gates of the drive transistors and the stability of the cell is enhanced. This is also a method of forming an SRAM cell.

7 Claims, 2 Drawing Sheets

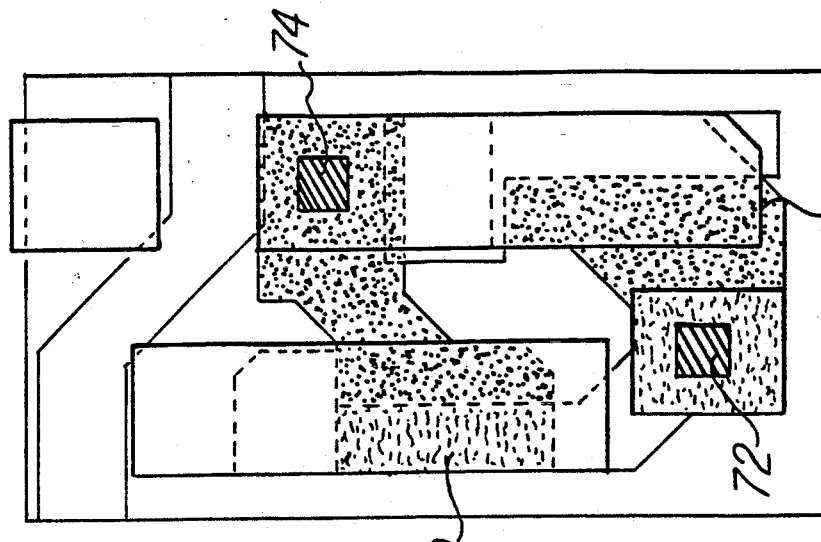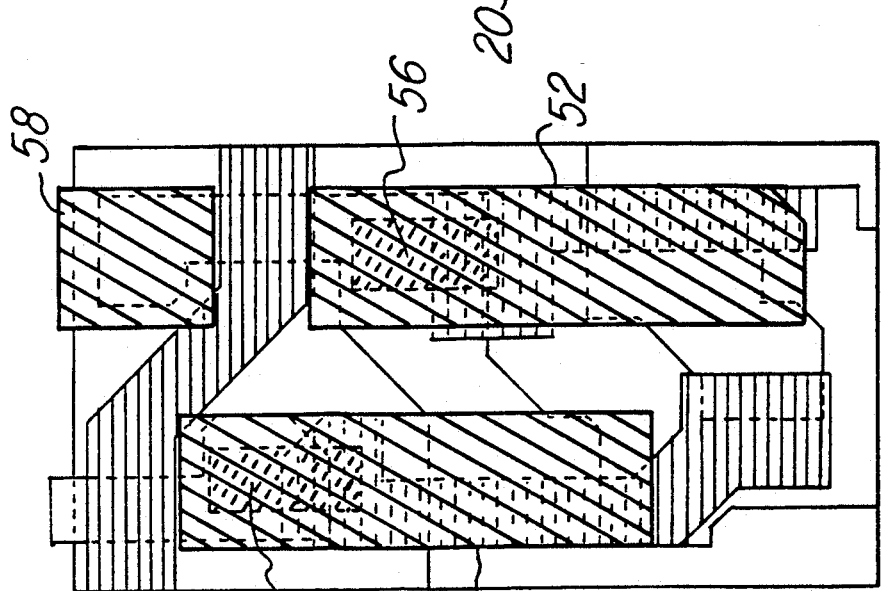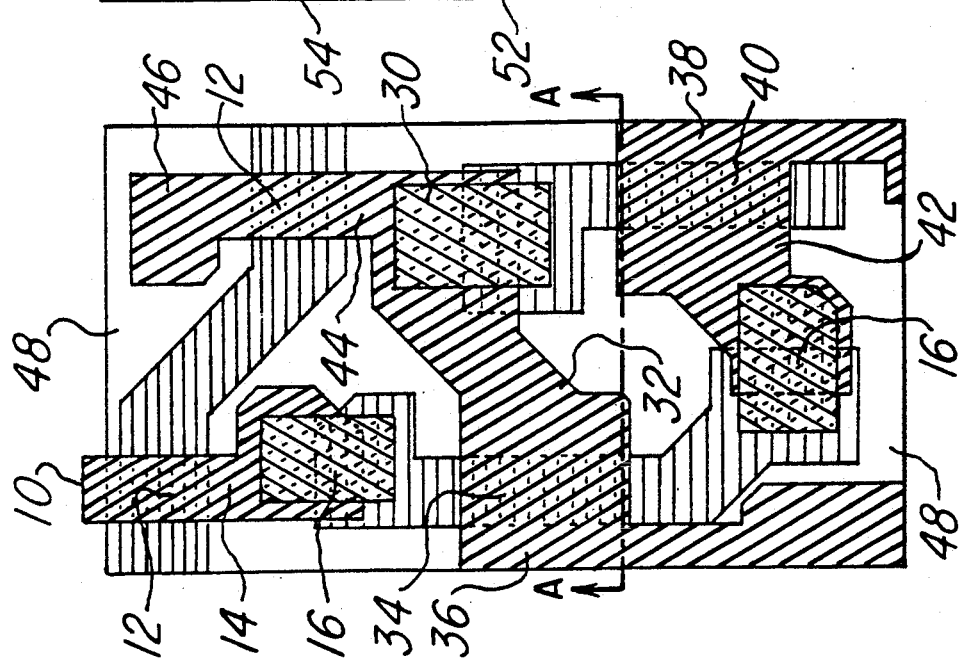

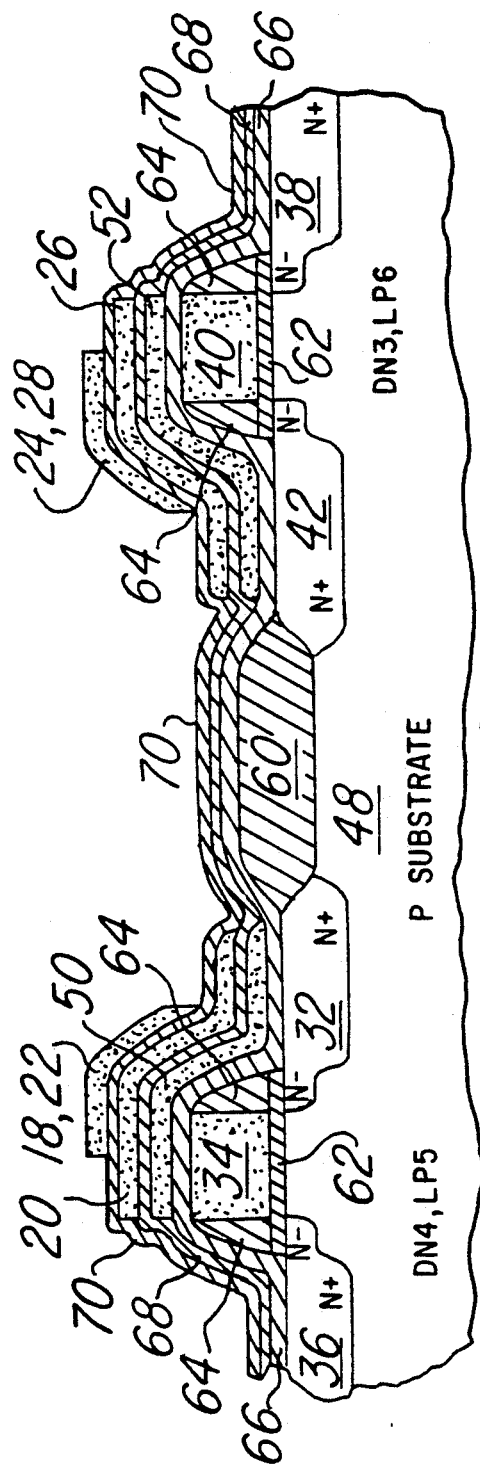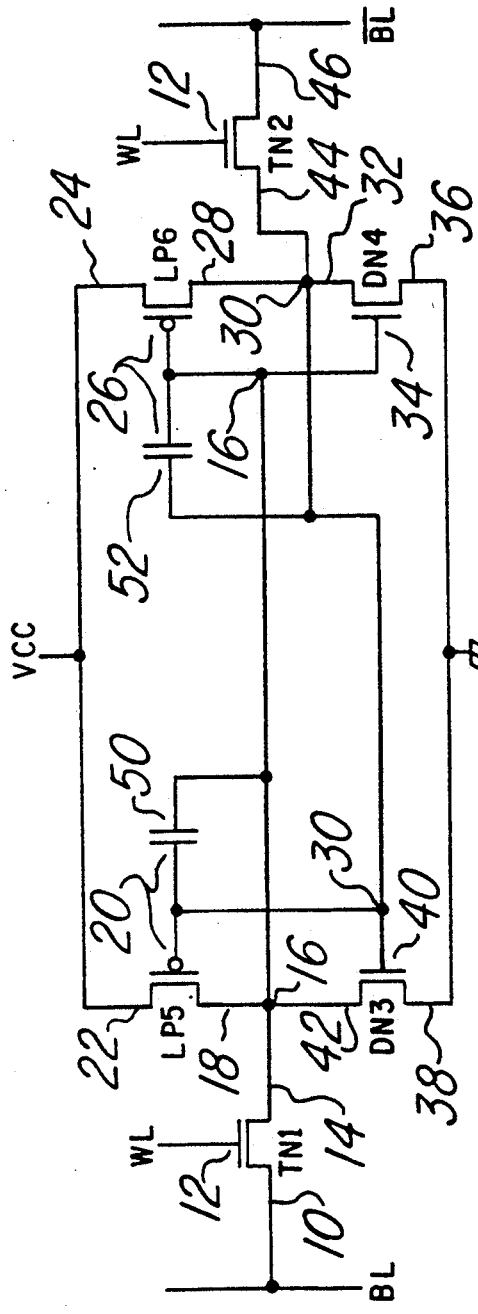
Fig.2
Fig.3

STACKED CAPACITOR SRAM CELL (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

This application is a continuation of application Ser. No. 07/928,248 now abandoned a division of 07/647,879 now U.S. Pat. No. 5,145,799, filed Aug. 11, 1992 and Jan. 30, 1991.

FIELD OF THE INVENTION

This invention generally relates to semiconductor fabrication methods and devices, and more specifically to static random access memory (SRAM) cell fabrication methods and devices.

BACKGROUND OF THE INVENTION

One approach to a SRAM cell is to use two coupled CMOS inverters (which is similar to an NMOS cell but with the load transistors in the NMOS cell replaced with PMOS transistors). The CMOS cell will require more area but the power consumption when the circuit is quiescent will be virtually eliminated. One method to improve the packing density of CMOS SRAMs is to stack the transistors one on top of another. This arrangement allows the circuit design to extend into the third dimension.

Low stand-by power and high speed operation are key factors for the next generation of SRAMs. In addition, high packing density SRAMs exhibit serious soft error problems under high speed operation. The storage node voltage tends to drop as the operation speed is increased. This voltage drop can allow alpha particles to cause soft errors.

SUMMARY OF THE INVENTION

This is an SRAM cell. The cell comprises: two NMOS drive transistors; two PMOS load transistors; first and second bottom capacitor plates, with the first plate being over a gate of one of the drive transistors and the second plate being over a gate of another of the drive transistors; a layer of dielectric material over the first and second bottom capacitor plates; and first and second top capacitor plates over the dielectric layer, with the first top capacitor plate forming a gate of one of the load transistors and with the second top capacitor plate forming a gate of another of the load transistors, whereby the capacitor plates form two cross-coupled capacitors between the gates of the drive transistors and the stability of the cell is enhanced. Preferably the dielectric material is oxide, nitride, tantalum oxide, or oxide and nitride.

This is also a method of forming an SRAM cell, the cell having first and second NMOS drive transistors, and first and second PMOS load transistors. The method comprises: forming a first bottom capacitor plate over a gate of the second drive transistor and second bottom capacitor plate over a gate of the first drive transistor; electrically connecting the first bottom capacitor plate to the second drive transistors gate; electrically connecting the second bottom capacitor plate to the first drive transistor gate; forming dielectric layer over the first and second bottom capacitor plates; forming first and second top capacitor plates over the dielectric layer, with the first top capacitor plate forming a gate of the first load transistor and being over the first bottom capacitor plate, and the second top capacitor plate forming a gate of the second load transistor and being over the second bottom capacitor plate; electrically connecting the first top capacitor plate to the first drive transistor gate; electrically connecting the second top capacitor plate to the second drive transistor gate; and forming PMOS channel films over the first and second top capacitor plates.

Preferably the first and second bottom capacitor plates are fabricated from silicon; the first and second top capacitor plates are fabricated from silicon; the first and second bottom capacitor plates are over gate sidewalls of the drive transistors; the first and second top capacitor plates are over gate sidewalls of the drive transistors; and the dielectric layer is oxide, nitride, tantalum oxide, or oxide and nitride.

BRIEF DESCRIPTION OF THE DRAWINGS

In the drawings:

FIGS. 1a-1c are layout views of a preferred embodiment of this invention, during sequential processing steps;

FIG. 2 is a cross-sectional view along line a—a of FIG. 1a after subsequent processing steps;

FIG. 3 is a schematic diagram of a preferred embodiment of this invention;

DETAILED DESCRIPTION OF PREFERRED EMBODIMENTS

As SRAM cell size decreases, the possibility of soft error increases due to lower cell capacitance. One technique to reduce soft error rate (SER) is to increase the cell capacitance. In particular, it is known that increasing the coupling capacitance between drive transistor gates results in a large reduction in SER without significantly decreasing access time. SRAM cells have been designed, using PMOS transistors stacked atop NMOS transistors, which increases such cross-coupling. However, this coupling capacitance is substantially larger than in previous SRAM cells if the effective area of elements (which contribute that capacitance) is increased (previously, the PMOS transistors were stacked, but conventional element sizes were used). The intent of this embodiment is to increase the aforementioned capacitance by such increases in effective area (and possibly, changes in the dielectric between such elements). The addition of capacitor plates is a practical way to increase the effective area.

A preferred embodiment of the present invention is shown, in FIGS. 1a-1c, during sequential processing steps. A cross-section (FIG. 2) and a schematic (FIG. 3) of this preferred embodiment are provided for clarification, and should be referred to when examining FIGS. 1a-1c. Table 1 below may also be used as a reference for the drawings. FIG. 1a shows the layout after formation of standard CMOS or BiCMOS well 48, formation of active regions (which includes the moat regions), the formation of drive transistor (DN3, DN4) gate regions 34,40, the formation of the access/transfer transistors (TN1, TN2) gate region 12, and the formation of gate to moat interconnects 16,30. The moat regions form the source 10 and drain 14 of TN1, the source 46 and drain 44 of TN2, the source 36 and drain 32 of DN4 and the source 38 and drain 42 of DN3. The interconnect is shown as a single mask process (e.g. using selective epitaxial silicon as an interconnect), however, a different method may be utilized. The source/drain regions and gate layer are n+ in doping and all transistors shown are fabricated in bulk silicon. The gates, moats, and interconnects may or may not be silicided depending on the choice of device technology. All of these regions can be seen in the schematic of FIG. 3., and the cross-sections of DN3 and DN4 are shown in FIG. 2.

In FIG. 1b, a layer of poly-Si is formed to create the bottom capacitor plates 50,52 (simultaneously a bit line landing pad 58 may be formed). The first bottom capacitor plate 50 is connected to DN4's gate 34 via contact hole 54 and the second bottom capacitor plate 52 is connected to DN3's gate 40 via contact hole 56. Note that the bottom capacitor plates 50,52 are much wider than the underlying gates 34,40, shown in FIG. 1b. Also, the plates 50,52 are along the oxide sidewalls, shown in FIG. 2, resulting in large vertical area of the bottom capacitor plates. These factors will result in a substantially increased coupling capacitance in the final device. If the bottom capacitor plates 50,52 were not used, the drive transistor gates 34,40 would serve as bottom plates, but this would result in a significant decrease in coupling capacitance.

A layer of dielectric material 68 (FIG. 2) is formed over the bottom capacitor plates 50,52. This layer may be oxide, nitride, oxide/nitride, tantalum oxide, or any dielectric whose presence will not create instabilities in the drive transistors. Adjacent to bottom capacitor plates 50,52 the dielectric material 68 may be thin, thereby increasing the Coupling capacitance in the final device.

Top capacitor plates 20,26 of poly-Si are formed on top of the dielectric layer, as shown in FIG. 1c. Note that only the top capacitor plates are marked in FIG. 1c for improved clarity. The first top capacitor plate 20 serves as load transistor LP5's gate 20 and the second top capacitor plate 26 serves as load transistor LP6's gate 26. The first top capacitor plate 20 is connected to DN3's gate 40 via contact hole 74 and the second top capacitor plate 26 is connected to DN4's gate 34 via contact hole 72. The top capacitor plates 20,26 overlap the portions of the bottom capacitor plates 50,52 which are over the drive transistor gates 34,40. The result is a significant increase in the coupling capacitance, due to the increase in the area of the resulting capacitor, when the bottom capacitor plates 50,52 are present.

After formation of the top capacitor plates 20,26 the PMOS channel film, including source and drain regions 18,22,24,28 (FIG. 2), is formed and connected to appropriate underlying layers. The channel region of the PMOS load transistors LP5 and LP6 may be defined using a resist mask. The significant portions of the device are complete and the remainder of the processing, such as metal layers, may be continued in the standard manner for SRAM devices.

A preferred embodiment has been described in detail hereinabove. It is to be understood that the scope of the invention also comprehends embodiments different from those described, yet within the scope of the claims. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| ELEMENT NUMBER | DESCRIPTION |
| --- | --- |
| 10 | SOURCE OF NMOS ACCESS/TRANSFER TRANSISTOR TN1 |
| 12 | WL & GATE OF TN1 & TN2 |
| 14 | DRAIN OF TN1 |
| 16 | INTERCONNECT POINT FOR DRAIN OF TN1, DRAIN OF LP5, DRAIN OF DN3, GATE OF LP6, GATE OF DN4, & BOTTOM CAPACITOR PLATE 50 |
| 18 | DRAIN OF PMOS LOAD TRANSISTOR LP5 |
| 20 | GATE OF LP5 & TOP CAPACITOR PLATE SECTION OVER BOTTOM CAPACITOR PLATE 50 |
| 22 | SOURCE OF LP5 |
| 24 | SOURCE OF PMOS LOAD TRANSISTOR LP6 |
| 26 | GATE OF LP6 & TOP CAPACITOR PLATE SECTION OVER BOTTOM CAPACITOR PLATE 52 |
| 28 | DRAIN OF LP6 |
| 30 | INTERCONNECT POINT FOR DRAIN OF TN2, DRAIN OF LP6, DRAIN OF DN4, GATE OF DN3, GATE OF LP5, AND BOTTOM CAPACITOR PLATE 52 |
| 32 | DRAIN OF NMOS DRIVE TRANSISTOR DN4 |
| 34 | GATE OF DN4 |
| 36 | SOURCE OF DN4 |
| 38 | SOURCE OF NMOS DRIVE TRANSISTOR DN3 |
| 40 | GATE OF DN3 |
| 42 | DRAIN OF DN3 |
| 44 | DRAIN OF NMOS ACCESS/TRANSFER TRANSISTOR TN2 |
| 46 | SOURCE OF TN2 |
| 48 | WELL REGION |
| 50 | BOTTOM CAPACITOR PLATE OVER DN4 |
| 52 | BOTTOM CAPACITOR PLATE OVER DN3 |
| 54 | CONNECT HOLE FOR BOTTOM CAPACITOR PLATE 50 |
| 56 | CONNECT HOLE FOR BOTTOM CAPACITOR PLATE 52 |
| 58 | BIT LINE CONTACT LANDING PAD |
| 60 | FIELD INSULATOR |
| 62 | GATE INSULATOR |
| 64 | SIDEWALL INSULATOR |
| 66 | FIRST INSULATOR LAYER |
| 68 | CAPACITOR DIELECTRIC LAYER |
| 70 | SECOND INSULATOR LAYER |

What is claimed is:

1. An SRAM cell, said cell comprising:
   a. first and second NMOS drive transistors;
   b. first and second PMOS load transistors;
   c. first and second bottom capacitor plates, with said first bottom capacitor plate being over and separate from a gate of said first drive transistor and said second bottom capacitor plate being over and separate from a gate of said second drive transistor;
   d. a layer of dielectric material over said first and second bottom capacitor plates; and
   e. first and second top capacitor plates over said dielectric layer, with said first top capacitor plate forming a gate of said first load transistor and with said second top capacitor plate forming a gate of said second load transistor, wherein said first bottom capacitor plate is connected to said gate of said first drive transistor, said second bottom capacitor plate is connected to said gate of said second drive transistor, said first top capacitor plate is connected to said gate of said second drive transistor, and said second top capacitor plate is connected to said gate of said first drive transistor such that coupling capacitance is created between said gates of said drive transistors.

2. A cell of claim 1, wherein said dielectric material is oxide.

3. A cell of claim 1, wherein said dielectric material is nitride.

4. A cell of claim 1, wherein said dielectric material is tantalum oxide.

5. A cell of claim 1, wherein said dielectric material contains oxide and nitride.

6. The cell of claim 1, wherein said bottom capacitor plates are polysilicon.

7. The cell of claim 2, wherein said top capacitor plates are polysilicon.

* * * * *